(12) United States Patent
Marino et al.

(10) Patent No.: US 7,994,824 B2
(45) Date of Patent: Aug. 9, 2011

(54) LOGIC GATE WITH A REDUCED NUMBER OF SWITCHES, ESPECIALLY FOR APPLICATIONS IN INTEGRATED CIRCUITS

(75) Inventors: Fabio Alessio Marino, San Jose, CA (US); Alessandro Paccagnella, Padua (IT)

(73) Assignee: Fabio Alessio Narino, San Jose, CA (US)

( * ) Notice: Subject to any disclaimer, the term of this patent is extended or adjusted under 35 U.S.C. 154(b) by 0 days.

(21) Appl. No.: 12/742,572

(22) PCT Filed: Nov. 14, 2008

(86) PCT No.: PCT/IT2008/000711
§ 371 (c)(1),
(2), (4) Date: May 12, 2010

(87) PCT Pub. No.: WO2009/063527
PCT Pub. Date: May 22, 2009

(65) Prior Publication Data
US 2010/0259301 A1    Oct. 14, 2010

(30) Foreign Application Priority Data

Nov. 14, 2007   (IT) .............................. PD2007A0381

(51) Int. Cl.
*H03K 19/094* (2006.01)
*H03K 19/20* (2006.01)
(52) U.S. Cl. ....................................... 326/112; 326/121

(58) Field of Classification Search .................. 326/112, 326/113, 93–98, 104–108, 121
See application file for complete search history.

(56) References Cited

U.S. PATENT DOCUMENTS

| 4,595,845 | A | * | 6/1986 | Briggs ........................... 326/113 |
| 4,896,057 | A | * | 1/1990 | Yang et al. .................... 326/116 |
| 5,701,094 | A | * | 12/1997 | Sridhar et al. ................ 326/113 |
| 6,603,333 | B2 | * | 8/2003 | Vinh et al. ....................... 326/98 |
| 6,624,665 | B2 | * | 9/2003 | Kim et al. ........................ 326/95 |
| 7,592,841 | B2 | * | 9/2009 | Kapoor ........................... 326/121 |

* cited by examiner

*Primary Examiner* — Shawki S Ismail
*Assistant Examiner* — Crystal L Hammond
(74) *Attorney, Agent, or Firm* — Bryan W. Bockhop

(57) ABSTRACT

Logic Gate (100), particularly for integrated circuits including a Boolean network (105) having at least an input (106) and having at least an output node (107) and at least a terminal (108) connected to a first node at fixed potential (109) corresponding to a first logical level of the gate. The gate is characterized by the fact that the output node (107) is connected to a first pair of switches including a first switch (101) and a second switch (102), which are activated alternately, and are connected respectively, by a respective terminal, to the first node (109) at fixed potential and to the output node (107). Between the two switches there is a second pair of switches (103, 104) connected to a second node at fixed potential (110) corresponding to a second logical level of the gate. The switches of the second pair of switches are connected together in a way that the turning on of one switch of the second pair involves the turning off of the other switch of the second pair and the turning on of one of the switches of the second pair is suitable to bring the output node (107) to the potential of the second node at fixed potential (110).

10 Claims, 7 Drawing Sheets

LOGIC GATE WITH A REDUCED NUMBER OF SWITCHES, ESPECIALLY FOR APPLICATIONS IN INTEGRATED CIRCUITS

TECHNICAL FIELD

The present invention relates to a logic gate with a reduced number of switches, especially for applications in integrated circuits.

BACKGROUND ART

Nowadays the realization of integrated circuits (IC) to high performances provides the use of digital structures in CMOS (Complementary Metal Oxide Semiconductor) technology.

In fact, such structures allow obtaining low power dissipation, high speeds and a considerable saving of area on chip.

All digital systems base the most of their working on combinational logic circuits, that is circuits having the property that at any point in time, the output of the circuit is related to its current input signals by some Boolean expression.

There are numerous circuit styles to implement a given logic function, each of which presents advantages and disadvantages, which mark it from the others.

These logic families can be divided mainly into two categories: static logic families and dynamic logic families. The Complementary CMOS logic, the pseudo-NMOS logic, the pass-transistor and the transmission gate logics belong to the first group. The dynamic logic with pre-charge phase, for example, belong to the second group.

The Complementary CMOS logic uses NMOS and PMOS exploiting their duality. The generic gate realized through Complementary CMOS logic presents the structure shown in FIG. 1, where the pull-up network (PUN) is a network formed by only PMOS, while the pull-down network (PDN) is a network formed by only NMOS.

Although the Complementary CMOS logic allows to have output logical levels of 0V e $V_{DD}$ (supply voltage) and wide noise margins and static power dissipation almost null, there are however disadvantages, such as the number of transistor required to implement a single gate is very high (2N MOSFET for a N fan-in logic gate), the propagation delay deteriorates rapidly as a function of the fan-in, big intrinsic capacitances whether incoming or outgoing are present.

The pseudo-NMOS logic, whose generic gate is shown in FIG. 1.(b), is attempt to reduce the number of transistors required to implement a given logic function with respect to the Complementary CMOS logic, replacing the pull-up network with a single pMOS transistor.

However, as consequence of the transistors reduction we have a low logical level that is different from 0V, the noise margins decrease and the static power dissipation become quite big.

Another type of logic style alternative to the Complementary CMOS one is the pass-transistor logic, which uses every transistor as one logic gate with two inputs.

The advantage of this structure, in addition to the static power dissipation almost null, is the use of "2(N−2)" transistors for one gate with N fan-in. However, the logic pass-transistor suffers of some drawbacks, including the high logical level is different from the supply voltage and the output of a gate realized through pass-transistor logic cannot drive the gate terminal of a MOSFET, the connection in series of pass-transistor logical gates is limited because this kind of gate does not enjoy the regenerative property; furthermore every gate needs also of some denied inputs.

In the dynamic logic with pre-charge (for example, with high pre-charge as that one illustrated in FIG. 4), only N+2 transistors are used to build a logic gate with N inputs, succeeding anyway to obtain logical output levels of 0V and VDD (supply voltage), a static power dissipation almost null, and low propagation times. The dynamic logic with pre-charge, however, has one of the two noise margins very small and a dynamic power dissipation higher than that one of the Complementary CMOS.

Furthermore, the dynamic logic with pre-charge is very sensitive to the capacitive couplings, because they can alter the output value "during the evaluation phase". Finally the operation frequency of these logic gates have a lower limit, since the leakage currents which tend to change the quantity of charge stored in the parasitic output capacitor even when it is in high impedance state.

DISCLOSURE OF THE INVENTION

The aim of the present invention is to overcome the drawbacks of the background art, by devising a logic gate structure which, although by requiring a reduced number of components, allows to have a static power dissipation essentially zero and output logical levels substantially equal to the low and high values of the supply voltages of the gate.

Within this aim, an object of the invention is to provide a logic gate structure which have low parasitic capacitances, both incoming and outgoing.

Another object of the invention is to provide a logic gate structure which have low delay propagation times and independent from the Boolean function implemented by the gate in witch the logic is applied.

Not last goal of the invention is to provide a logic gate structure which is highly reliable, relatively easy to provide and at competitive costs.

This aim and these and other objects, which will become better apparent hereinafter, are achieved by a logic gate especially for integrated circuits applications including a Boolean network having at least an input and at least one output node, at least a terminal connected to a first node with a fixed potential corresponding to the first logical level of the gate, characterized by the fact that the output node is connected to a first pair of switches including a first switch and a second switch, which are activated alternately, and are connected respectively, through a respective terminal, to the first node with a fixed potential and to the output node, between the two first switches a second pair of switches connected to a second node with a fixed potential corresponding to a second logical level of the gate, the switches of the second pair of switches are connected together in a way that the turning on of one of the two switches of the second pair involves that the other one of the second pair turns off and that the turning on of one of the switches of the second pair is appropriate to bring the output node to the fixed potential of the second node.

BRIEF DESCRIPTION OF THE DRAWINGS

Further characteristics and advantages of the invention will become better apparent from the following detailed description of a preferred but not exclusive embodiment of the device according to the invention, illustrated by way of non-limiting example in the accompany drawings, wherein:

FIGS. 8a and 8b shown the components enabled of the logic gate of FIG. 5 at the beginning of a second phase, here called "evaluation phase", respectively in the case in which the Boolean network is off and that one in which the network is on;

WAYS OF CARRYING OUT THE INVENTION

Figure 1:
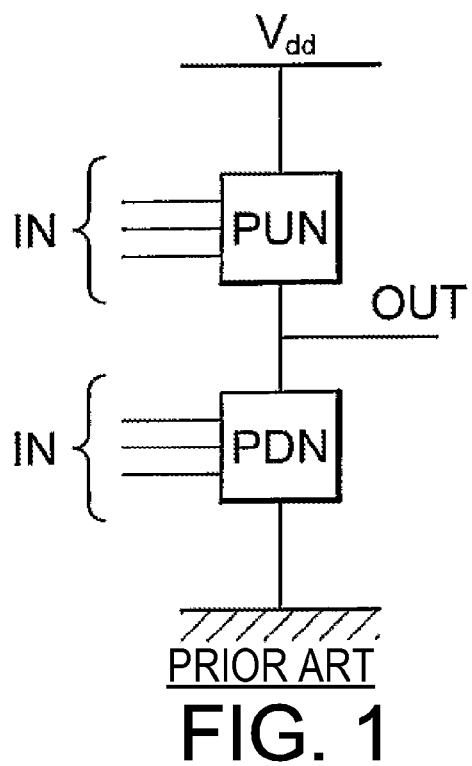
FIG. 1 is a view of a structure of a Complementary CMOS logic gate type known.
Figure 2:
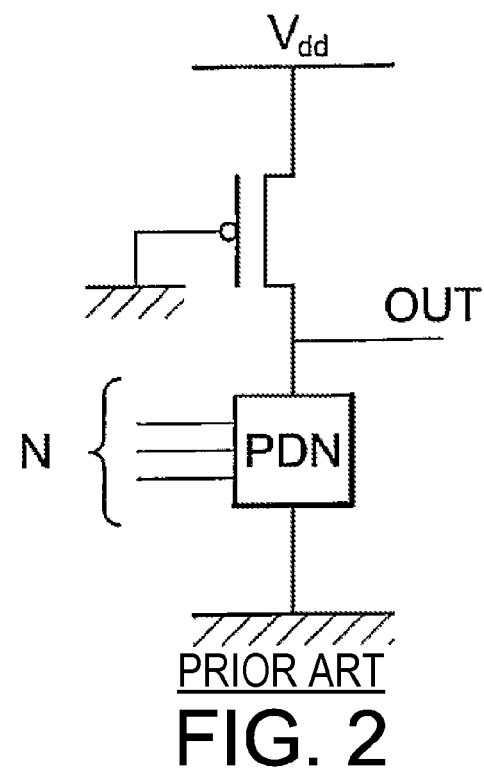
FIG. 2 is a view of a structure of a pseudo-NMOS logic gate type known.
Figure 3:
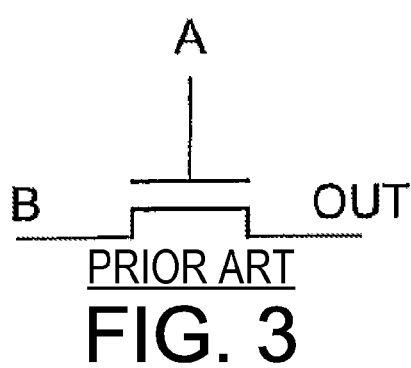
FIG. 3 is a view of a structure of a Pass-transistor logic gate type known.
Figure 4:
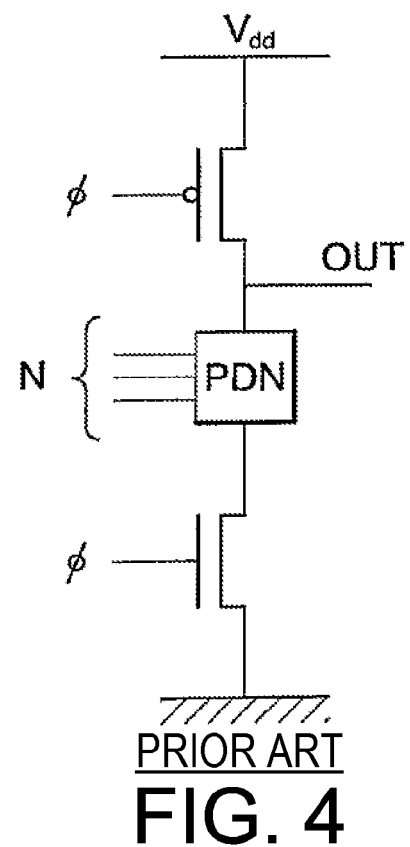
FIG. 4 is a view of a structure of a dynamic logic gate with high pre-charge type known.

With reference to the previous figures, the logic gate according to the invention, indicated globally with the reference number 100 or 200, according to whether version we are talking about: with pull-down or pull-up Boolean network, includes a Boolean network or combinational 105, 205 with at least one input 106, 206 (for example, N inputs) and at least a output node 107, 207 and at least a terminal 108, 208 connected to a first node at fixed potential 109, 209 corresponding to a logic level of the logic gate.

Figure 5:
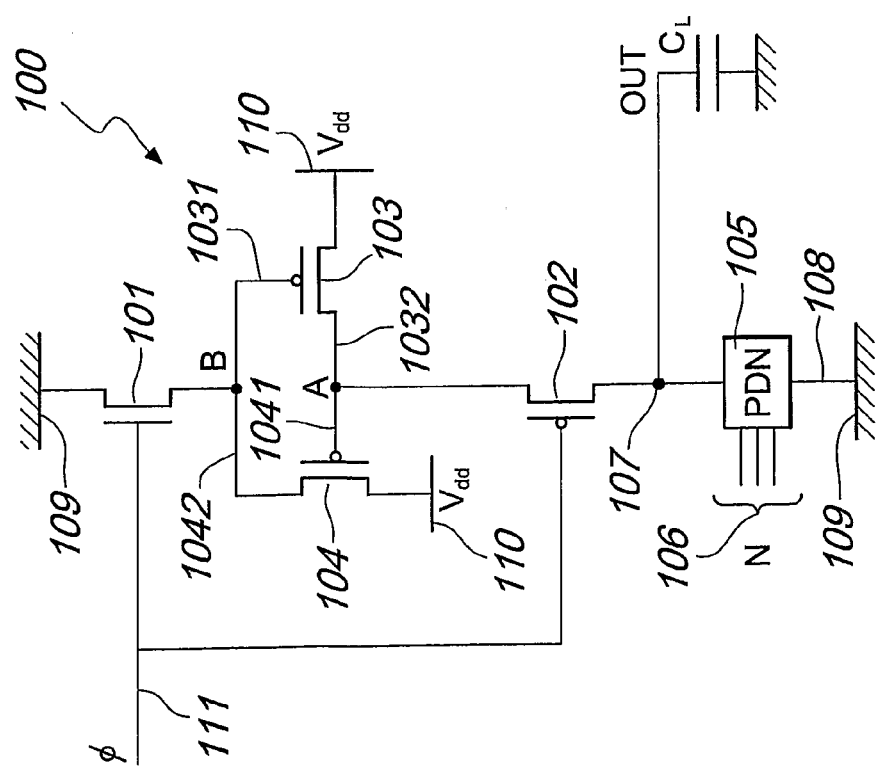
FIG. 5 is a view of a structure of a logic gate according to a first form of invention embodiment.

In the case of the logic gate 100, illustrated in FIG. 5, the Boolean network 105 is a pull-down network or a network formed by only n-channel field effect transistors, and the first node at fixed potential 109 is the ground, i.e. the low logical level. In the logic gate 200, illustrated in FIG. 6, the Boolean network 205 is a pull-up network or a network formed by only p-channel field effect transistors, and the first node at the fixed potential 209 corresponds to the supply voltage VDD, i.e. the high logical level.

Anyway, the Boolean network 105, 205 is a network suitable to perform a combinational function based on the input signals 106, 206 and to give the function result on a output node 107, 207, eventually in the denied form. The implementation of Boolean networks corresponding to the networks 105 and 205 using switches is well known to the person skilled and will not be discussed in detail here.

The output node 107, 207 is connected to a first pair of switches including a first switch 101, 201 and a second switch 102, 202, which are activated alternately, and are connected respectively, trough an respective terminal, to the first node with a fixed potential 109, 209 and to the output node 107, 207.

In particular, the switches of the first pair may be three or four terminal devices, for example field effect transistors, i.e. switches with a control terminal, as the gate terminal in field effect transistor. To allow the alternating activation of the switches of the first pair 101, 102 or 201, 202, this terminal of activation can, for example, be common to the two switches of the first pair, that are chosen so that a determinate logical level (for example, of the clock signal) on the common terminal 111, 211 involves that a switch of the first pair turns on and the other one turns off.

Figure 6:
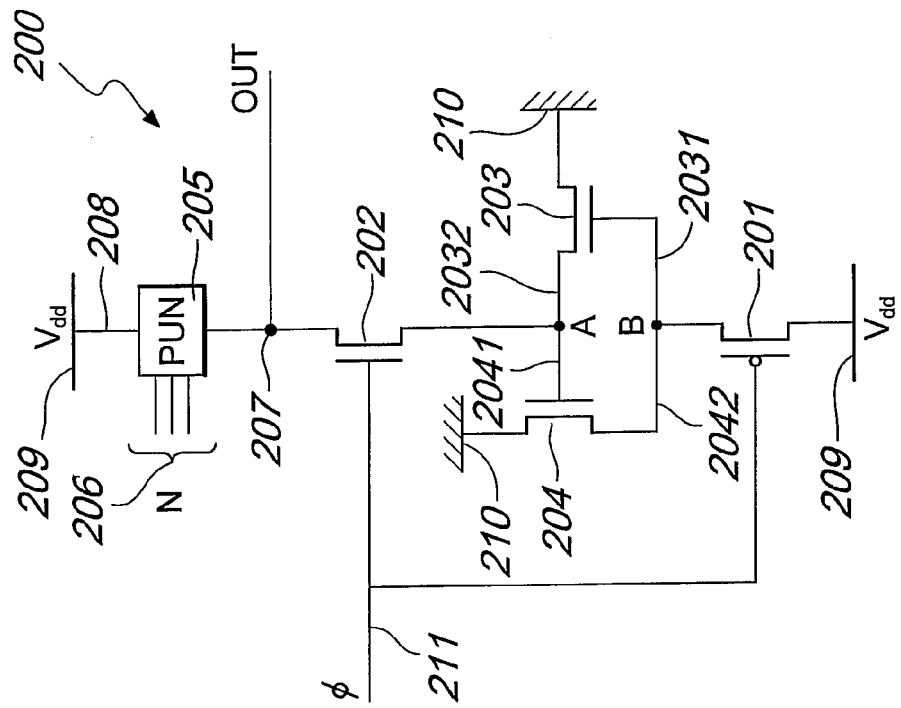
FIG. 6 is a view of a structure of a port logic according to a second form of invention embodiment.

For example, the common terminal 111, 211 can be obtained by connecting together the gate terminals of two field effect transistors or MOSFETs having channels type N and P, as shown in FIGS. 5 and 6.

In particular, in the first form of invention embodiment illustrated in FIG. 5, the first switch 101 is a n-channel MOSFET and the second switch 102 is a p-channel MOSFET transistor, which have their gate terminals connecting together to obtain the common terminal 111 suitable to receive a clock signal.

In the second form of invention embodiment illustrated in FIG. 6, the first switch 201 is a p-channel MOSFET transistor, and the second switch 202 is a n-channel MOSFET transistor, having their gate terminals connected together to obtained the common terminal 111 suitable to receive a clock signal.

Alternatively, if field effect transistors with the same type of channel are preferred, a logic gate NOT or inverter can be used to send the clock signal to a transistor and the denied version to the other one of the pair or similar solutions that allow to turn on and to turn off the two transistors alternately.

Between the two switches 101, 102 or 201, 202 of the first pair there is a second pair of switches 103, 104 or 203, 204 connected to a second node 110, 210 at a fixed potential corresponding to a second level of the logical gate, which is the high logical level in the case of the first form of embodiment of FIG. 5 and is the low logical level in the case of the second form of embodiment of FIG. 6.

The switches 103, 104 or 203, 204 of the second pair of switches are connected together in a way that when one of the switches of the second pair turns on the other one of the second pair turns off and when one of the switches of the second pair turns on, the output node 107, 207 is bring to the potential of the second node at fixed potential 110, 210.

Preferably, each one of the switches 103,104 or 203,204 of the second pair is connected, through a respective common node A, B, to an respective switch 101, 102 or 201, 202 of the first pair in order to bring the current of the respective switch of the first pair to or from the second node at fixed potential 110, 210.

Furthermore, each one of the switches of the second pair includes a respective control terminal 1031, 1041 or 2031, 2041 which is connected directly to the node B, A which this switch has in common with the respective switch of the first pair.

As illustrated in FIGS. 5 and 6, the second pair of switches are field effect transistors, with channel type opposite to that one of the transistors contained in the Boolean network of the logic gate.

In particular, the first switch 103 of the second pair of switches is a p-channel MOSFET transistor, with the drain terminal 1032 connected, in correspondence of the node A, to the source terminal of the MOSFET transistor 102, corresponding to the second switch of the first couple of switches, in order to be able to carry the current request from the transistor 102 from the second node at fixed potential 110.

Similarly, the drain terminal 1042 of the second switch 104 of the second pair of switches is connected, in correspondence of the node B, to the drain terminal of the MOSFET transistor 101, corresponding to the first switch of the first pair of switches, in order to be able to carry the current request from the transistor 101 from the second node at fixed potential 110. Also the second switch 104, in the particular form of embodiment of FIG. 5, is a p-channel MOSFET transistor.

The gate terminal 1031 of the first switch 103 of the second pair of switches is also connected to the node B. Similarly, the gate terminal 1041 of the second switch 104 of the second pair of switches is connected to the node A.

As can be easily noted, the connections between the first and the second pair of switches in the second form of embodiment of the invention, as illustrated in FIG. 6, correspond, in the dual version, to those of the first invention embodiment. In particular, the switches 203 and 204 of the second pair of switches are n-channel MOSFET transistors, the drain of one and gate terminal of the other one are connected together and with the nodes A and B of the first pair of switches in a way to form a mesh.

It may further noted that the logic gate that use the logic of FIG. 5 have low parasitic capacitances, both incoming and outgoing. Furthermore, in a logic gate as that one of FIG. 6, since after the high impedance phase the node A (if the Boolean network 105 is turned off) is pre-charged to the supply voltage VDD, it is possible to show that the propagation time of the switching from the low level to the high one is given by:

$$t_{PLH} = 0.69 C_F (R_{P3} + R_{P2})$$

where $C_F$ is the total capacity of the node 207, that include the parasitic capacity relating to this node, while RP3 and RP2 are the equivalent resistance of transistors 103 and 102 (when these are turned on), respectively.

The propagation time of the switching from high level to the low one (tPHL) is, instead, zero, since the N inputs of the Boolean network 205 switch during the high-impedance phase. Similarly, in the logic gate of FIG. 6 the propagation time tPLH is zero, while the propagation time tPHL is proportional to total capacity of the output node and to the sum of the equivalent resistance of the transistors 202 and 203.

It can be also calculated that the static power dissipation is almost null, and the dynamic power dissipated by the output node in the case of the logic gate of FIG. 5 is given by:

$$P_{dynF} = C_F V_{DD} (V_{OH} - V_{OL}) f_{out} = C_F V_{DD}^2 \alpha_{out} f_{CLK}$$

where $_{out}$, said "switching activity", is the likely to have in exit, given a switching of the input signals, a switching from the low level to the high one or vice versa, and fCLK is the frequency of the clock signal.

In the form of invention embodiment illustrated in FIG. 5, the devices are chosen and dimensioned in such a way that the series of the second switch 102 of the first pair and the Boolean network 105 will be able to counter the first switch 103 of the second pair, bringing the node A to a voltage VA equal to the sum of the potential of the second node at fixed potential 110 (VDD) and the threshold voltage (Vtp4) of the second switch 104 of the second pair of switches.

Therefore, equalizing the currents that go through the switches 102, 103 and the Boolean network 105 in the critical bias point corresponding to the situation where VA=VDD+Vtp4, we found that:

$$\frac{Z_2}{Z_3} \geq \frac{V_{tp0}\left(V_{DD} + \frac{3}{2}V_{tp0}\right)(1 + \lambda_p V_{tp0})}{V_{Dsatp}(V_{DD} + V_{tp0} + V_{tp2} + V_{Dsatp}/2)} = K_1$$

$$[1 + \lambda_p(-V_{DD} - V_{tp0})]$$

where Z2 and Z3 are the form factors of the MOSFET transistors 102 and 103, VDsatp is the saturation voltage of the velocity of a pMOS, Vtp2 is the threshold voltages of the pMOS transistor 102, Vtp3=Vtp4=Vtp0 is the threshold voltage of the transistors 103 and 104, p is the modulation length of the channel of a pMOS.

The form factor of the transistor equivalent to the Boolean network 105, preferably, is chosen superior, or equal to the ratio between the form factor of the transistor 102 and the threshold voltage of the transistor 102, multiplied by a factor dependent on the technology used.

A similar design can be done for the logic gate of FIG. 6.

Figure 7:
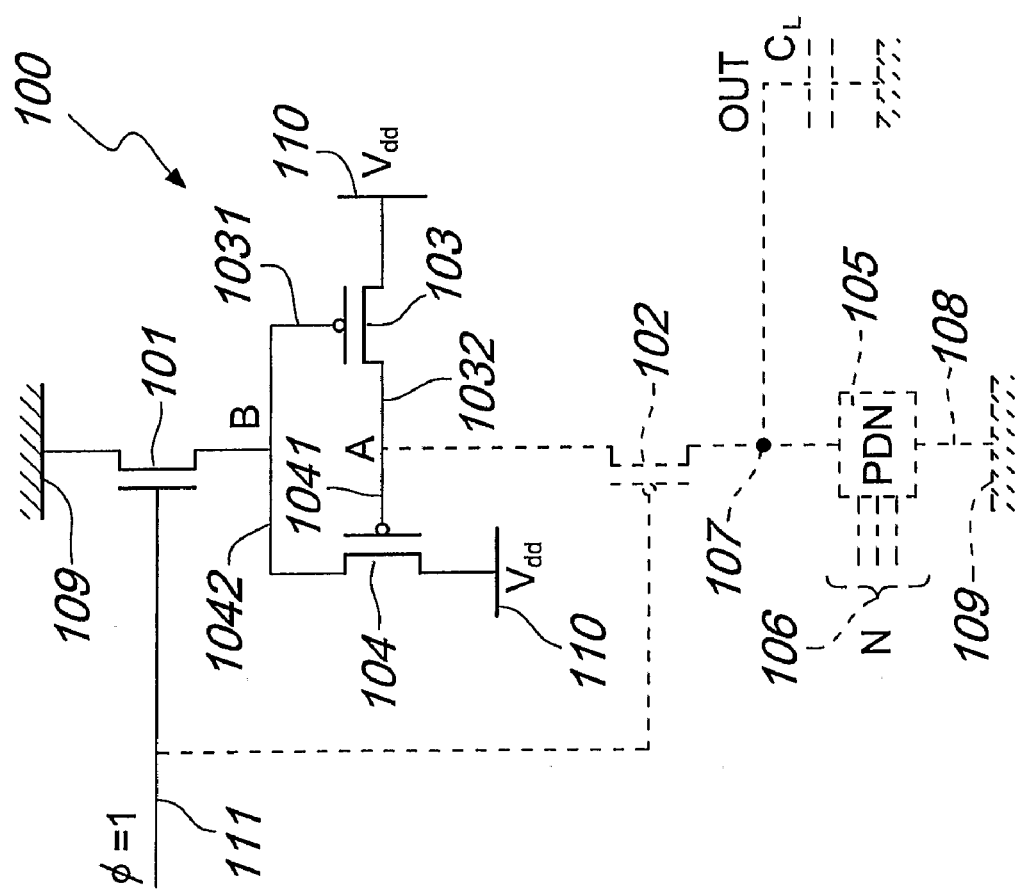
FIG. 7 shown the components enabled of the logic gate of FIG. 5 during a first phase here call "high impedance phase'.
Figures 8A, 8B:
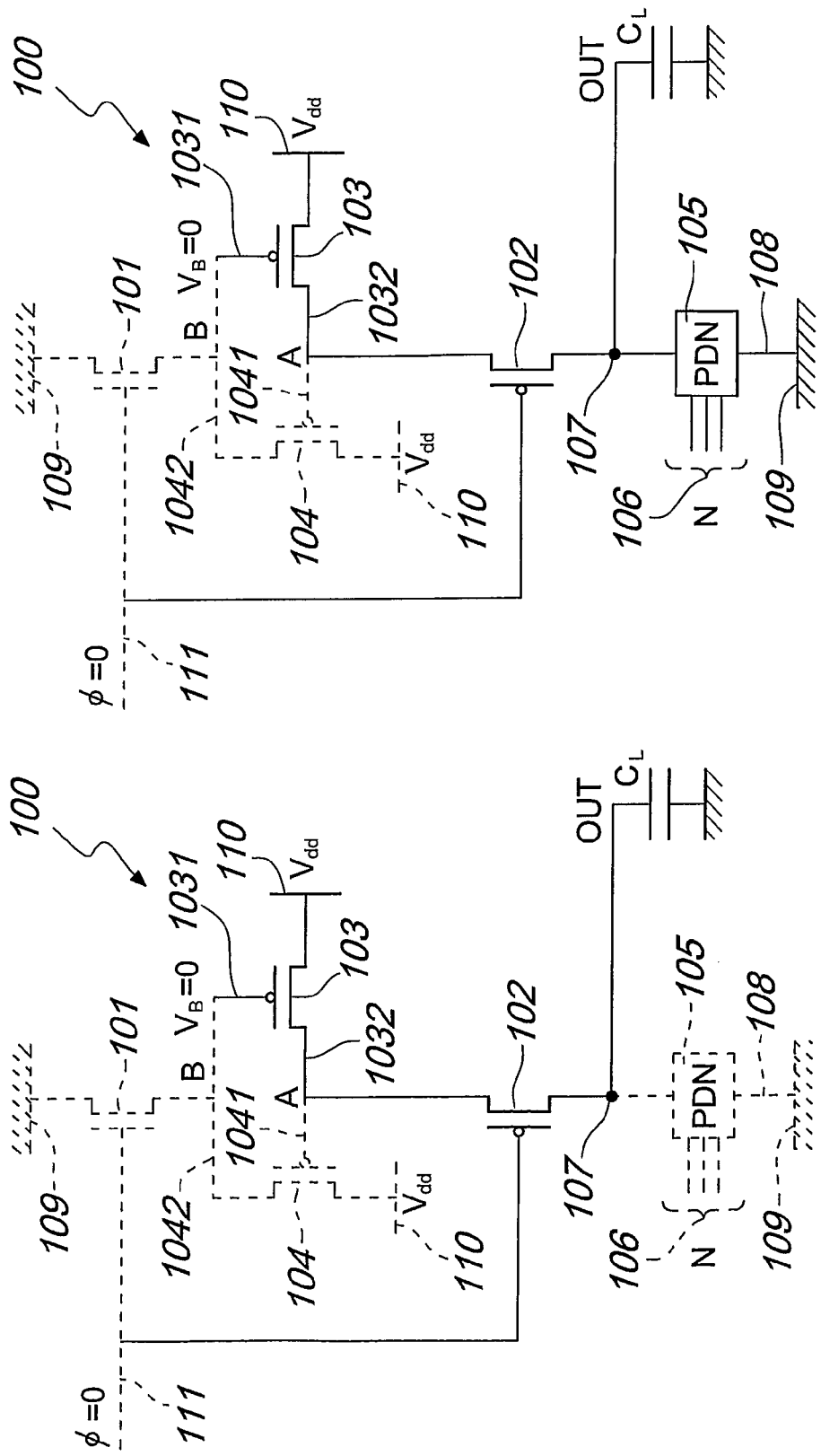

The operation mode of the logic gate in agreement with the invention can be better understood with reference to the FIGS. 7 and 8a-8b, representing two phase that will be here referred as "high impedance phase" and "evaluation phase", alternate through the use of the clock signal as input of the common terminal 111, 211 of the switches of the first couple of switches. The figures refer to the first form of embodiment, illustrated in FIG. 5.

In the phase called high impedance phase, corresponding to the high level of the clock signal (=1), the nMOS transistor 101 is turned on, while the PMOS transistor 102 is turned off. As result, the node B is bring to ground, i.e. to the same potential of the first node 109, so it turns on the pMOS 103 that bring the node A to the supply voltage VDD, turning off the pMOS transistor 104 (if it is on).

During this phase, the logic gate output 107 is in a high impedance state if the Boolean network 105 is off, or connected to ground if the Boolean network 105 is on. In the evaluation phase, corresponding to the low level of the clock signal (=0), the transistor nMOS 101 is off while the pMOS transistor 102 is on.

In order to understand this phase is useful to distinguish the following two cases.

If, during the switching from 1 to 0 of the clock signal the Boolean network 105 is off and remains off for all the evaluation phase (FIG. 8a), we have that, before the transistor 102 turns on, the output node 107 of the logic gate is in high impedance state and, therefore, when the transistor 102 turns on, it connects the node 107 to the node A, i.e. directly to the supply voltage trough the transistor 103, charging the capacitance CL of the output node 107.

If, however, when the clock signal switch from 1 to 0, the Boolean network 105 is on and remains on for all the evaluation phase (FIG. 8b), then we have that, before the transistor 102 turns on, the output node 107 of the logic gate is connected to ground and therefore the capacity CL has been discharged. When the transistor 102 turns on, the transistor 101 is off. Since the node B has been pre-charged to zero during the high impedance phase, we have that the pMOS transistor 103 is on and the potential of the node (VA) tends to fall down.

This situation reaches the equilibrium just when the node A fall below the sum between VDD and the threshold voltage (Vtp4) of the transistor 104, i.e. when the transistor 104 turns on, turning off immediately the transistor 103.

In fact, at this point, the node A is connected to the ground voltage through the transistor 102 and the Boolean network 105, and therefore it can quickly go to the potential −Vtp2, corresponding to the voltage of the node A for witch the transistor 102 turns off. At the same time the output node 107 goes to 0V.

During this phase, the node B is connected to the potential of the second node 110 (VDD) by the transistor 104. Therefore, once the transistor 103 is turned off, will be no longer possible to turn it on until the high impedance phase is started again. It follows that the inputs can switch only during the high impedance phase and must remain constant throughout the evaluation phase.

Of course, the operation mode just described, although it is referred to the circuit in the first form of invention embodiment of FIG. 5, can be also applied to the circuit of FIG. 6. In particular, if =0, the logic gate is in high impedance phase, while if =1, the logic gate is in the evaluation phase. In the last case, if the Boolean network 205 is on, the output voltage is equal to VDD, while if the Boolean network 205 is off, the output voltage is 0V.

The logic gate thus defined can be applied to implement several logic functions, implemented through the Boolean network 105, 205, as in the knew CMOS Complementary logic gates. This means that, given a logic function F with logical sums (OR) and logical products (AND), there are two ways to implement it.

Figures 9, 10:
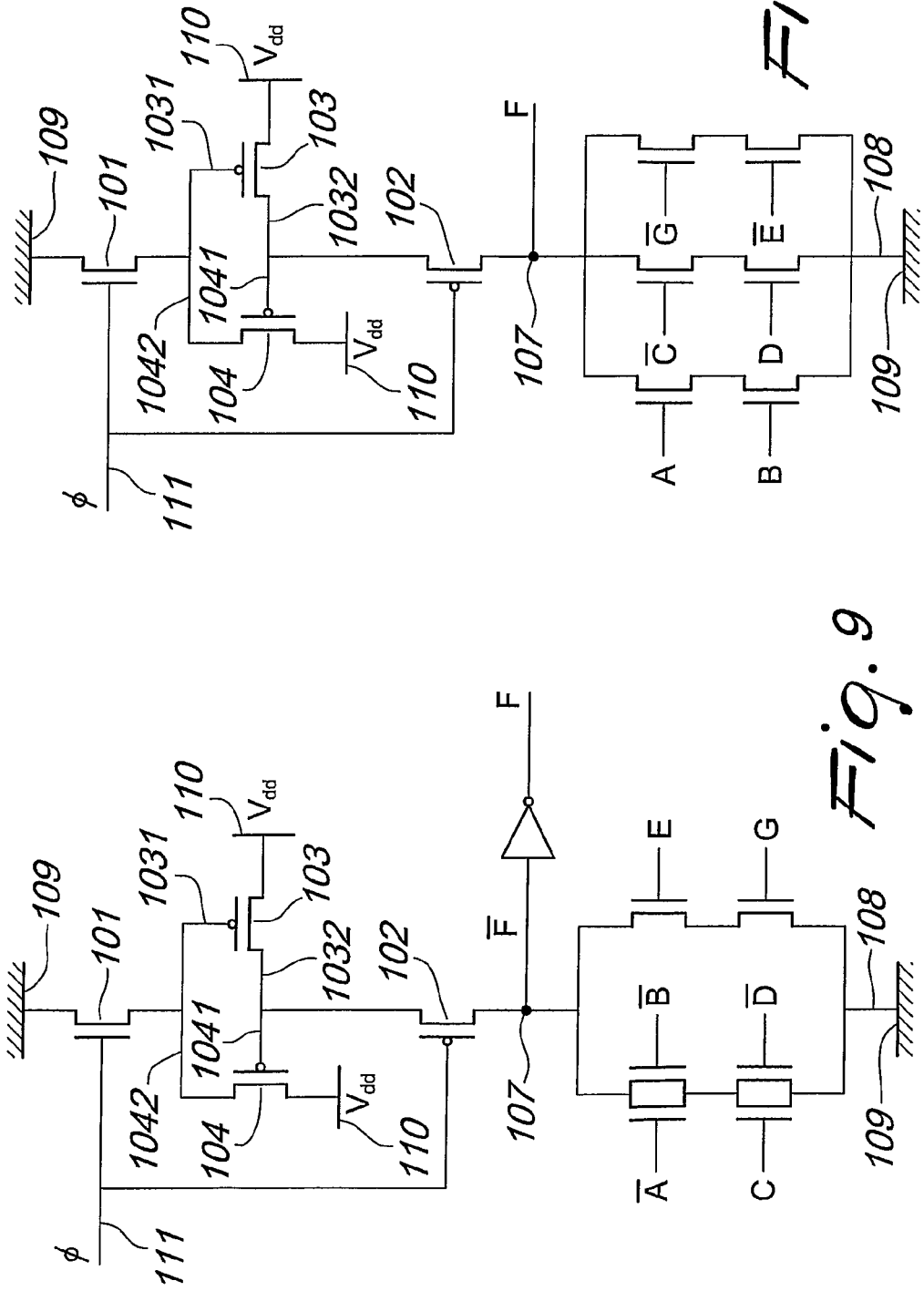
FIG. 9 is a view of a first implementation of a logic function based on the gate of FIG. 5.
FIG. 10 is a view of a second implementation of a logic function based on the gate of FIG. 5.

In the first way, the Boolean network 105, 205 includes transistors in series to implement each AND function and/or transistors in parallel to obtain each OR function, and an inverter can be putted on the output node 105. An example of this first method is shown in FIG. 9, where is illustrated the implementation of the function:

$$F=\overline{A \cdot B \cdot (C+D)+E \cdot G}=\overline{(A+B)} \cdot \overline{(C+D)}+\overline{E \cdot G}$$

Otherwise, the Boolean network 105, 205 includes transistors in series to implement each OR function and/or transistors in parallel to obtain each AND function. In FIG. 10 is shown an example of the logic function:

$$F=\overline{(A+B) \cdot (C+D) \cdot (G+E)}$$

Figure 12:
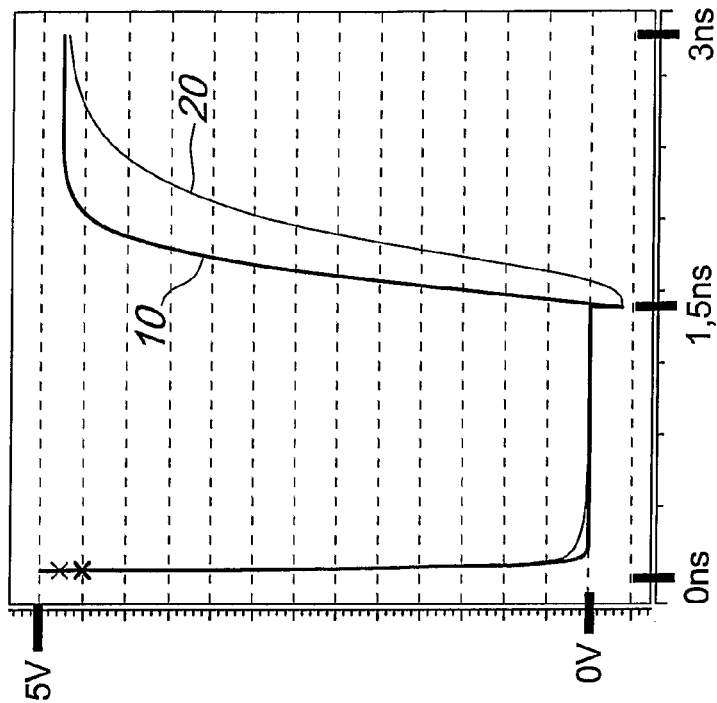
In FIG. 12 are plotted the output voltage of the logic gate of FIG. 11 (NOR with six inputs) compared with the plots of a NOR gate with four inputs implemented in Complementary CMOS logic.
Figure 11:
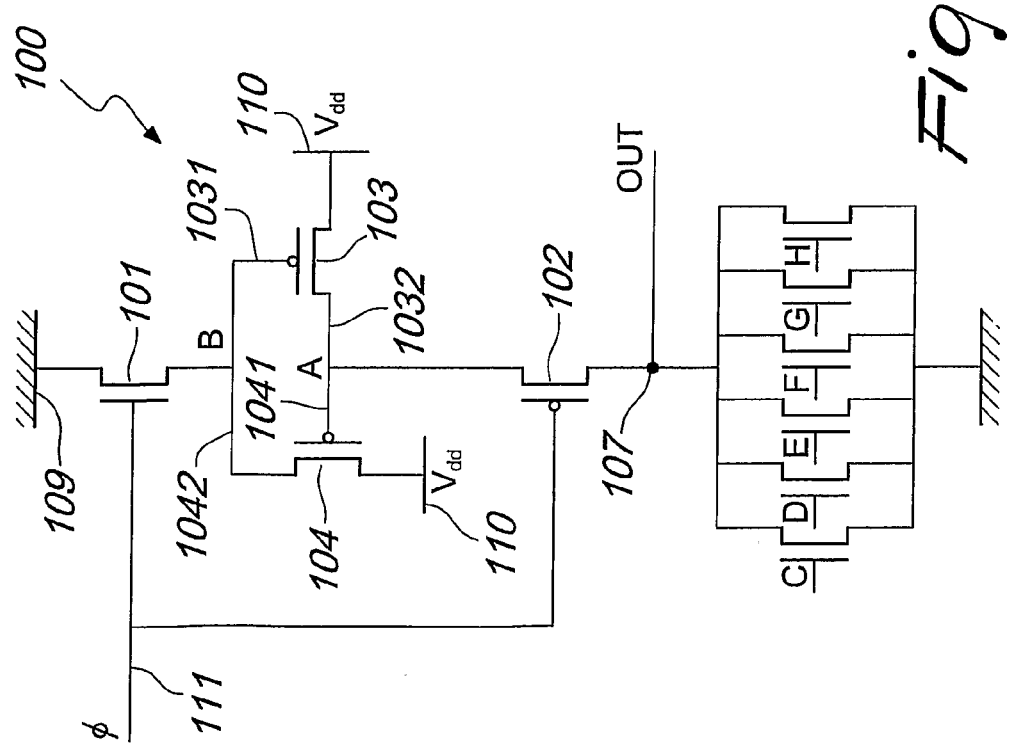
FIG. 11 is a view of a NOR logic gate based on the logic gate of FIG. 5.

A further example of function implementation is given in FIG. 11, where a logic gate NOR with six inputs agreement with the invention is illustrated. Assuming that only the input C change in function of the time and all other inputs remain to zero, it is possible to see that the evolution 10 of the output voltage of the circuit of FIG. 11 is faster than the corresponding trend 20 of the output of a conventional gate NOR with four inputs implemented in Complementary CMOS logic (FIG. 12).

Figure 13:
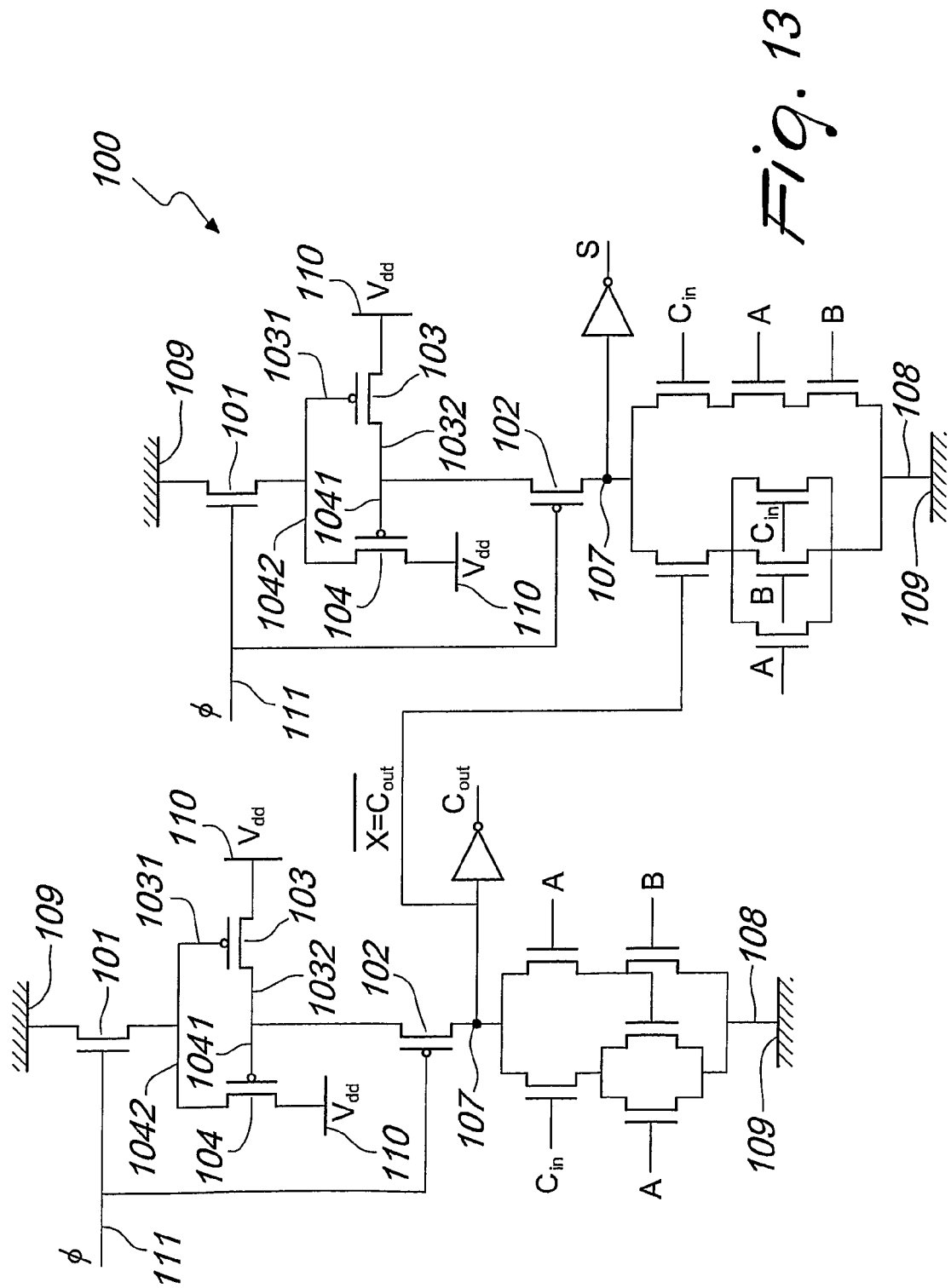
FIG. 13 is a full adder implemented by logic gates shown in FIG. 5.

Another example of application is illustrated in FIG. 13, which report a full adder unit build with logic gates in agreement with the invention. As known, a full adder has two bit (A and B) that must be added together and a carry (CIN) as inputs, and has a carry-out (Cout) and the result of the sum (S) as outputs.

The two logical functions implemented are $$C_{out}=A \cdot B+(A+B) \cdot C_{in}$$

and $$S=A \cdot B \cdot C_{in}+\overline{C_{out}} \cdot (A+B+C_{in})$$

A full adder built with the known Complementary CMOS logic required 28 MOSFET transistors, 14 of which are p-channel type, and it has very long propagation times, due mainly to the pull-up networks of the gate.

Instead, using the logic gates in agreement with the invention, as shown in FIG. 13, 24 MOSFET transistors are necessary, only 8 of which are p-channel type. Furthermore, both the parasitic capacitances and both the propagation times are dramatically reduced compared with the Complementary CMOS solution. These advantages are even more big on adder or multipliers with N bit, since these ones use "N" or more full-adder units.

In practice it has been found that the logical gate according to the invention fully achieves the intended aim, since it requires a reduced number of components, allows to have a static power dissipation essentially zero and output logical levels equal to the low (0V) and high (VDD) values of the supply voltages of the logical gate.

Furthermore, the logic gate according to the invention has low parasitic capacitances, both incoming and outgoing, and has propagation times independent from the Boolean function implemented.

Although the device according to the invention has been designed in particular for integrated circuits made in CMOS technology, it can be used, more generally, for any digital circuit.

The device thus conceived is susceptible of numerous modifications and variations, all of which are within the scope of the appended claims; all the details may further be replaced with other technically equivalent elements.

The disclosures in Italian Patent Application No. 019667 from which this application claims priority are incorporated herein by reference.

Where technical features mentioned in any claim are followed by reference signs, those reference signs have been included for the sole purpose of increasing the intelligibility of the claims and accordingly, such reference signs do not have any limiting effect on the interpretation of each element identified by way of example by such reference signs.

The invention claimed is:

1. A logic gate for integrated circuits, comprising:
    a Boolean network including at least an input and at least an output node and including at least a terminal connected to a first node at fixed potential corresponding to a first logical level of the said logic gate;
    a first pair of switches including a first switch and a second switch, said second switch directly coupled to said output terminal and to a first internal node, said first switch directly coupled to said first node at fixed potential and a second internal node; and
    a second pair of switches including a third switch and a fourth switch, said third switch directly coupled to a second node at fixed potential corresponding to a second logical level of said logic gate, and said first internal node, said fourth switch directly coupled to said second node at fixed potential and said second internal node,
    wherein said first switch and said second switch are activated alternately, and wherein said third switch and said fourth switch are coupled together so that when one of said third switch and said fourth switch turns on, the other one of said third switch and said fourth switch turns off.

2. The logic gate of claim 1, wherein said first switch comprises a first control terminal and said second switch comprises a second control terminal, and wherein said first control terminal and said second control terminal are directly coupled together, and are configured to receive a clock signal.

3. The logic gate of claim 2, wherein said first switch and said second switch include field effect transistors of opposite conductivity type, and wherein said first and said second control terminal are the gate terminals of said field effect transistors.

4. The logic gate of claim 1, wherein said first switch comprises a first control terminal and wherein said second switch comprises a second control terminal, wherein said third switch comprises a third control terminal, wherein said fourth switch comprises a fourth control terminal, wherein said third control terminal is directly coupled to said second internal node, and wherein said fourth control terminal is directly coupled to said first internal node.

5. The logic gate of claim 1, wherein said Boolean network comprises at least one field effect transistor of a first conductivity type, and wherein said third and said fourth switch are field effect transistors of a second conductivity type.

6. The logic gate of claim 1, wherein said first switch is a field effect transistor of a first conductivity type, and wherein said second, third and fourth switch are field effect transistors of a second conductivity type.

7. The logic gate of claim 1, wherein said Boolean network comprises at least one field effect transistor of a first conductivity type, wherein said second, third and fourth switch are field effect transistors of a second conductivity type, and wherein said first switch is a field effect transistor of said first conductivity type.

8. The logic gate of claim 1, wherein said third and said fourth switch are field effect transistors, wherein the gate terminal of said third switch is directly coupled to the drain of said fourth switch, and wherein the gate of said fourth switch is directly coupled to the drain of said third switch.

9. The Logic gate according to claim 1, wherein the said Boolean network includes transistors in series to implement each AND function and/or transistors in parallel to implement each OR function.

10. The Logic gate according to claim 1, wherein the said Boolean network includes transistors in series to implement each OR function and/or transistors in parallel to implement each AND function.

* * * * *